US006967608B1

(12) United States Patent
Maloberti et al.

(10) Patent No.: US 6,967,608 B1
(45) Date of Patent: Nov. 22, 2005

(54) SIGMA-DELTA ANALOG-TO-DIGITAL CONVERTER (ADC) WITH TRUNCATION ERROR CANCELLATION IN A MULTI-BIT FEEDBACK DIGITAL-TO-ANALOG CONVERTER (DAC)

(75) Inventors: Franco Maloberti, Plano, TX (US); Jiang Yu, Plano, TX (US); Koh Jinseok, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/877,015

(22) Filed: Jun. 25, 2004

(51) Int. Cl.[7] .............................................. H03M 3/00
(52) U.S. Cl. .................................................... 341/143
(58) Field of Search ............................... 341/143, 155, 341/144

(56) References Cited

U.S. PATENT DOCUMENTS

| | | | | |
|---|---|---|---|---|
| 6,313,774 | B1 * | 11/2001 | Zarubinsky et al. | 341/143 |
| 6,452,687 | B1 * | 9/2002 | Suzuki et al. | 358/1.1 |
| 6,518,903 | B1 * | 2/2003 | Perraud et al. | 341/143 |
| 6,781,533 | B2 * | 8/2004 | Yap et al. | 341/143 |
| 6,825,784 | B1 * | 11/2004 | Zhang | 341/131 |
| 6,842,129 | B1 * | 1/2005 | Robinson | 341/143 |
| 2002/0093442 | A1 * | 7/2002 | Gupta | 341/143 |

* cited by examiner

*Primary Examiner*—Peguy JeanPierre
(74) *Attorney, Agent, or Firm*—Ronald O. Neerings; Wade James Brady, III; Frederick J. Telecky, Jr.

(57) ABSTRACT

A method for reducing the complexity of a multi-bit DAC in a sigma-delta ADC. The DAC resolution can be made to be less than that of the quantizer by canceling truncation error present in multi-bit DACs. Truncation errors are introduced by differences between the digital output word of the quantizer and the digital input word of the feedback DAC(s). The truncation error(s) can be cancelled and eliminated from the system transfer function. A preferred embodiment comprises expanding all feedback loops in the ADC, adding an adjusted truncation error for each feedback loop to an inner feedback loop, and then calculating a correction term for each adjusted truncation error. The correction term can be calculated by zeroing all signals except for the adjusted truncation error being canceled and then calculating a truncation error transfer function.

20 Claims, 9 Drawing Sheets

SIGMA-DELTA ANALOG-TO-DIGITAL CONVERTER (ADC) WITH TRUNCATION ERROR CANCELLATION IN A MULTI-BIT FEEDBACK DIGITAL-TO-ANALOG CONVERTER (DAC)

CROSS-REFERENCE TO RELATED APPLICATIONS

This application is related to the following co-pending and commonly assigned patent application Ser. No. 10/860,620, entitled "A Method for Reducing DAC Resolution in Multi-bit Sigma Delta Analog-to-Digital Converter (ADC)," filed Jun. 3, 2004, which application is hereby incorporated herein by reference.

TECHNICAL FIELD

The present invention relates generally to a method for signal processing, and more particularly to a method for reducing the complexity of a multi-bit DAC in sigma-delta ADCs.

BACKGROUND

Sigma-delta modulators, which can be used in a sigma-delta analog-to-digital converter (ADC) or a sigma-delta digital-to-analog converter (DAC), can provide a degree of shaping (filtering) of quantization noise that can be present. The higher the order of the sigma-delta modulator, the further the quantization noise is pushed into the frequency band and the greater the separation between the signal being converted and the quantization noise. As such, sigma-delta ADCs and DACs (and their attendant modulators) have become popular in high frequency and high precision applications.

However, sigma-delta modulators do not offer noise shaping for noise that is due to a mismatch of the unity elements used in a DAC (referred to as a feedback DAC, that is a part of a feedback loop in the sigma-delta modulator) and a quantizer. The mismatch can therefore be a problem in the sigma-delta modulator if it is of significant magnitude. The mismatch can result in an overall reduction in the signal-to-noise ratio (SNR) of the sigma-delta modulator.

One solution that can be used to reduce the mismatch that is present in the feedback DAC is to use a feedback DAC with high linearity. A useful technique used to improve the DAC linearity is commonly referred to as dynamic element matching (DEM). Its use can reduce the mismatch in the sigma-delta modulator.

A disadvantage of the prior art is that even if the mismatch can be transformed into noise, it can remain unshaped and become a component in the signal band, and thus having an impact on the SNR of the sigma-delta modulator.

A second disadvantage of the prior art is that if the feedback DAC has high resolution, then it can potentially be difficult to achieve an effective DEM. A high resolution feedback DAC may require a large number of elements, and too many elements to average can lead to tones in the signal band for signals with low input levels.

SUMMARY OF THE INVENTION

These and other problems are generally solved or circumvented, and technical advantages are generally achieved, by preferred embodiments of the present invention which provides for a method for canceling noise in a sigma-delta modulator.

In accordance with a preferred embodiment of the present invention, a method for truncation error cancellation in a sigma-delta analog-to-digital converter (ADC) is presented. The method comprises expanding all feedback loops in the sigma-delta ADC and adding an adjusted truncation error ($E_j$) to be injected in a feedback loop J to an inner feedback loop. The method further comprises calculating a correction term for each adjusted truncation error ($E_j$).

In accordance with another preferred embodiment of the present invention, a method for truncation error cancellation in a sigma-delta analog-to-digital converter (ADC), the method comprising expanding all feedback loops in the sigma-delta ADC, and then, starting from outermost feedback loop J, a truncation error ($E_j$) is placed in an inner feedback loop. Additionally, an adjustment for the truncation error ($E_j$) is calculated, wherein the adjustment for the truncation error cancels out the truncation error ($E_j$) in the feedback loop J. This is repeated for each feedback loop in the sigma-delta ADC.

The invented solution reduces the complexity of the DEM and even avoids using the DEM technique to provide for the targeted resolution in multi-bit sigma-delta ADC. The method cancels out the truncation error due to less number of bits in the feedback digital-to-analog converter (DAC) than the number of bits of quantizer in a sigma-delta modulator. This can remove any contribution to the overall noise level in the sigma-delta modulator due to the truncation error. This is an important noise source since the truncation error can contribute significantly to the overall noise level.

Another advantage of a preferred embodiment of the present invention is that the possible digital hardware required to dynamically match the unity elements of the DAC is replaced by less complex digital circuitry to achieve digital noise shaping located in the feedback loop.

Yet another advantage of a preferred embodiment of the present invention is that instead of simply shaping the truncation error to a higher order, where it may still contribute to the overall noise level of the sigma-delta modulator, the truncation error can be eliminated completely. Therefore, the truncation error offers no contribution to the overall noise level in the sigma-delta modulator.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a second-order sigma-delta modulator. The invention may also be applied, however, to other sigma-delta modulators of different order (first order and higher). These sigma-delta modulators can be used in sigma-delta analog-to-digital converters (ADCs) and/or sigma-delta digital-to-analog converters (DACs).

Figure 1:
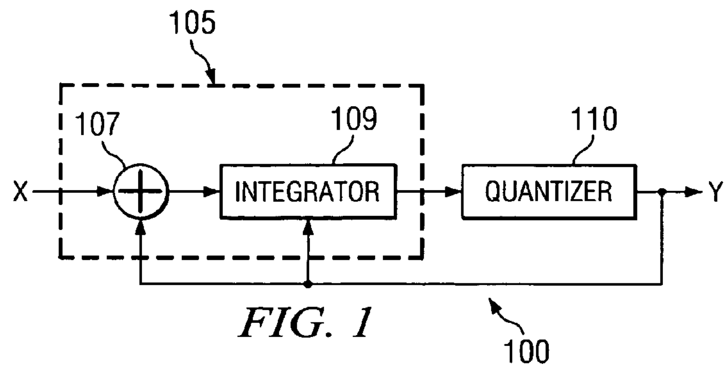
FIG. 1 is a diagram of a sigma-delta modulator.

With reference now to FIG. 1, there is shown a diagram illustrating a sigma-delta modulator 100. The sigma-delta modulator 100 is the heart of a sigma-delta ADC or DAC and basically digitizes an analog signal with a low resolution DAC at a very high sampling rate. Note that the sigma-delta modulator 100 makes use of the oversampling of the analog signal and noise shaping to increase the effective resolution of the conversion. Noise shaping involves the filtering and moving of the quantization noise from within a frequency band of interest into frequency bands above the frequency band of interest.

The sigma-delta modulator 100 can achieve a shaping of the quantization noise of its input signal X via the use of a sample-data network 105. The sample-data network 105 may comprise an adder 107 which can be used to subtract a quantized output from the input signal X and an integrator 109. The integrator 109 may be implemented as a simple adder to accumulate the output of the adder 107. The integrator 109, however, may be of higher order. The output of the sample-data network 105 can be provided to a quantizer 110, which can be used to convert an analog output of the sample-data network 105 into a discrete representation. The output of the quantizer 110, Y, can also be used as the quantized output, which is subtracted from the input signal X. Note that the quantized output may need to be converted back into an analog signal (via a DAC (not shown)) prior to subtraction from the input signal X.

The quantizer 110 may convert the output of the sample-data network 105 into a series of discrete values, wherein each discrete value can be a series of bits. The number of bits per discrete value is dependent upon the number of bits in the quantizer 110. If the quantizer 110 has a relatively high number of bits (perhaps, four bits or more), then more data can be conveyed in the output signal Y and a lower frequency of discrete values may be needed. If the quantizer 110 has a low number of bits (one or two bits), then less data can be conveyed per discrete value and a higher frequency may be needed.

Figure 2:
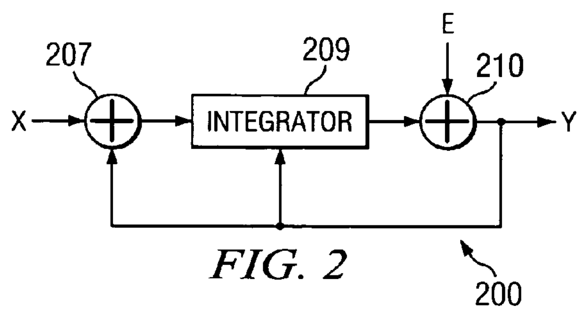
FIG. 2 is a diagram of a linear model of a sigma-delta modulator.

With reference now to FIG. 2, there is shown a diagram illustrating a linear model 200 of a sigma-delta modulator. The linear model 200 of a sigma-delta modulator, such as the sigma-delta modulator 100 shown in FIG. 1, can be arrived at by replacing components of the sigma-delta modulator 100 with their linear equivalents. The adder 107 and the integrator 109 (both from FIG. 1) can be readily replaced with linear models adder model 207 and integrator model 209. The quantizer 110 (FIG. 1), however, may not have a linear model. However, the quantizer 110 can be modeled as an additive noise source E that can be added to the output of the integrator model 209 with an adder 210. The additive noise source E may be the result of an error from the operation of the quantizer 110. The error, commonly referred to as quantization error, may arise from a difference in a value of a signal being quantized and its quantized value. For example, if the quantizer 110 is a single-bit quantizer, then the quantized value may take on the value of either zero or one. If the value being quantized has any value other than a zero or a one, then there will be a quantization error. If the value being quantized has a value of 0.8 and is quantized to a one value, then the quantization error may be 0.2.

Figure 3:
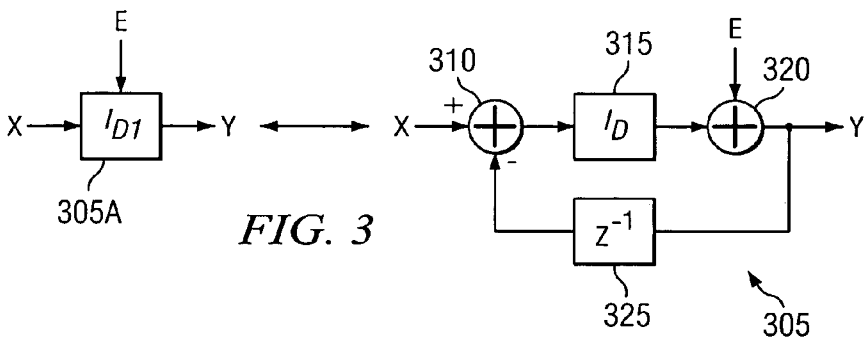
FIG. 3 is a diagram of a digital first-order sigma-delta modulator with its simplified representation.

With reference now to FIG. 3, there is shown a diagram illustrating a digital first-order sigma-delta modulator 305 with its simplified representation. The first-order sigma-delta modulator 305, which comprises an adder 310, an integrator 315, an additive noise source E with adder 320, and a delay block 325, has been simplified for ease of discussion. Let a symbol "I" represent a transfer function expressible as $$\frac{z^{-1}}{1-z^{-1}},$$

which may be an analog integrator with one delay, a symbol "$I_0$" represent a transfer function expressible as $$\frac{1}{1-z^{-1}},$$

which may be an analog integrator with no delay, a symbol "$I_D$" represent a transfer function expressible as $$\frac{1}{1-z^{-1}},$$

which may be a digital integral with no delay and can be realized with an adder and a register (neither shown), and a symbol "D" represent a transfer function expressible as $1-z^{-1}$, which may be a differentiator.

Using the symbols defined above, the first-order sigma-delta modulator 305 can be simplified into a box 305A with a symbol "$I_{D1}$," which can represent a first-order digital integrator. The inputs to the first-order sigma-delta modulator 305: an input signal X and a quantization error E, have been preserved in the box 305A along with the output signal Y.

Figure 4:
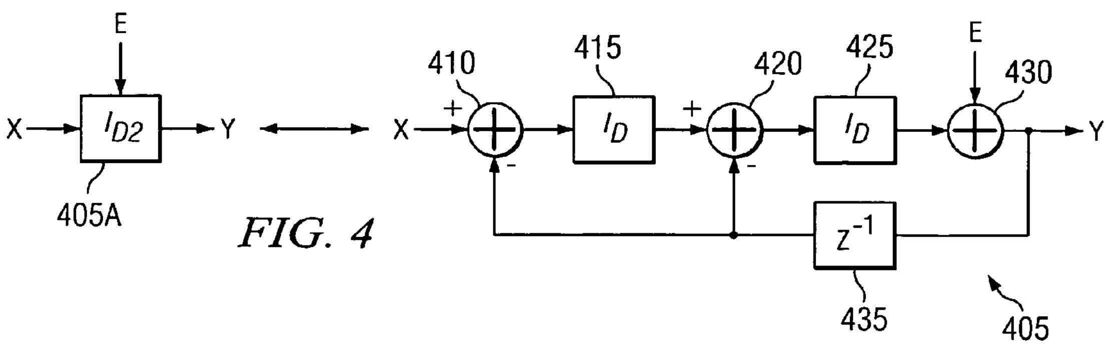
FIG. 4 is a diagram of a digital second-order sigma-delta modulator with its simplified representation.

With reference now to FIG. 4, there is shown a diagram illustrating a digital-second-order sigma-delta modulator 405 with its simplified representation. The second-order sigma-delta modulator 405 may comprise a pair of adders 410 and 420, a pair of integrators 415 425, an additive noise source E with adder 430, and a delay block 435. The integrators 415 and 425 are denoted using the symbols defined previously. The second-order sigma-delta modulator 405 can be simplified into a box 405A with a symbol "$I_{D2}$," which can represent a second-order digital integrator. The inputs to the first-order sigma-delta modulator 405: an input signal X and a quantization error E, have been preserved in the box 405A along with the output signal Y.

Figure 5:
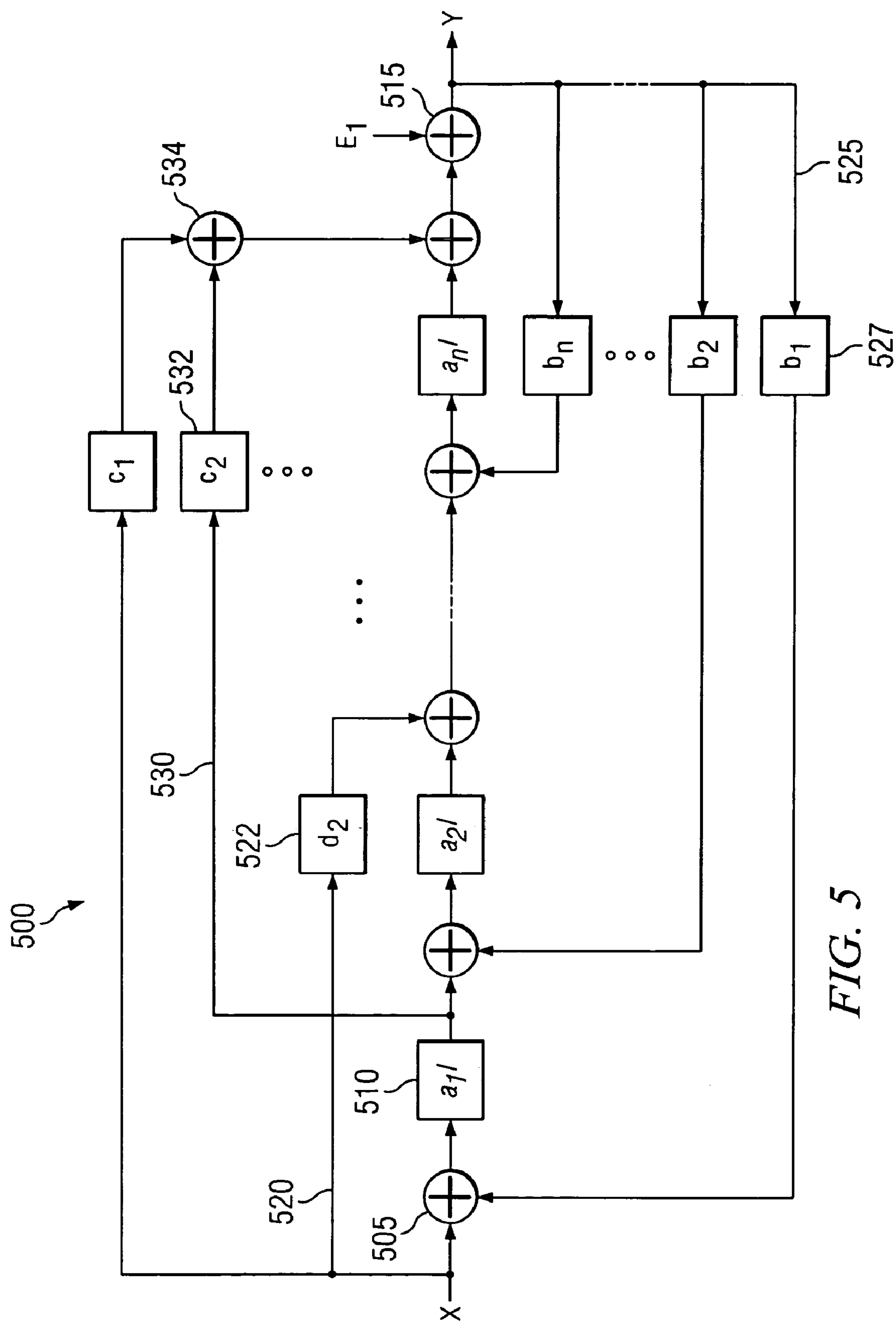
FIG. 5 is a diagram of a linear model of a generic N-th order single loop sigma-delta modulator.

With reference now to FIG. 5, there is shown a diagram illustrating a linear model of a generic N-th order single-loop sigma-delta modulator 500. The generic N-th order single-loop sigma-delta modulator 500, or N-th order sigma-delta modulator 500 for short, has a main signal path containing a plurality of analog integrators, such as integrator 510. For an N-th order sigma-delta modulator, there are N analog integrators. The N-th order sigma-delta modulator 500 may also have a quantizer, which can be modeled as a linear model as an additive noise source $E_1$ that can be added to the output of the N-th order sigma-delta modulator 500 by an adder 515. The N-th order sigma-delta modulator 500 may also have a plurality of feedback loops, such as feedback loop 525. A feedback loop may have a transfer function, which for the feedback loop 525 can be represented as block 527. For example, a feedback loop may have zero delay, singular delay, or the feedback loop may contain a sigma-delta modulator or so on. A feedback loop can be combined back into the main signal path via an adder, such as an adder 505, which can be associated with the integrator 510.

The N-th order sigma-delta modulator 500 may also feed-forward loops, such as loops 520 and 530, as well as cross-over interconnections between different modules. Like the feedback loops, the feed-forward loops may have transfer functions. A feed-forward loop's transfer function may be represented as blocks, such as blocks 522 and 532 for feed-forward loops 520 and 530. Cross-over interconnections between different modules and integrators can be combined together at adders such as adder 534.

Figure 6:
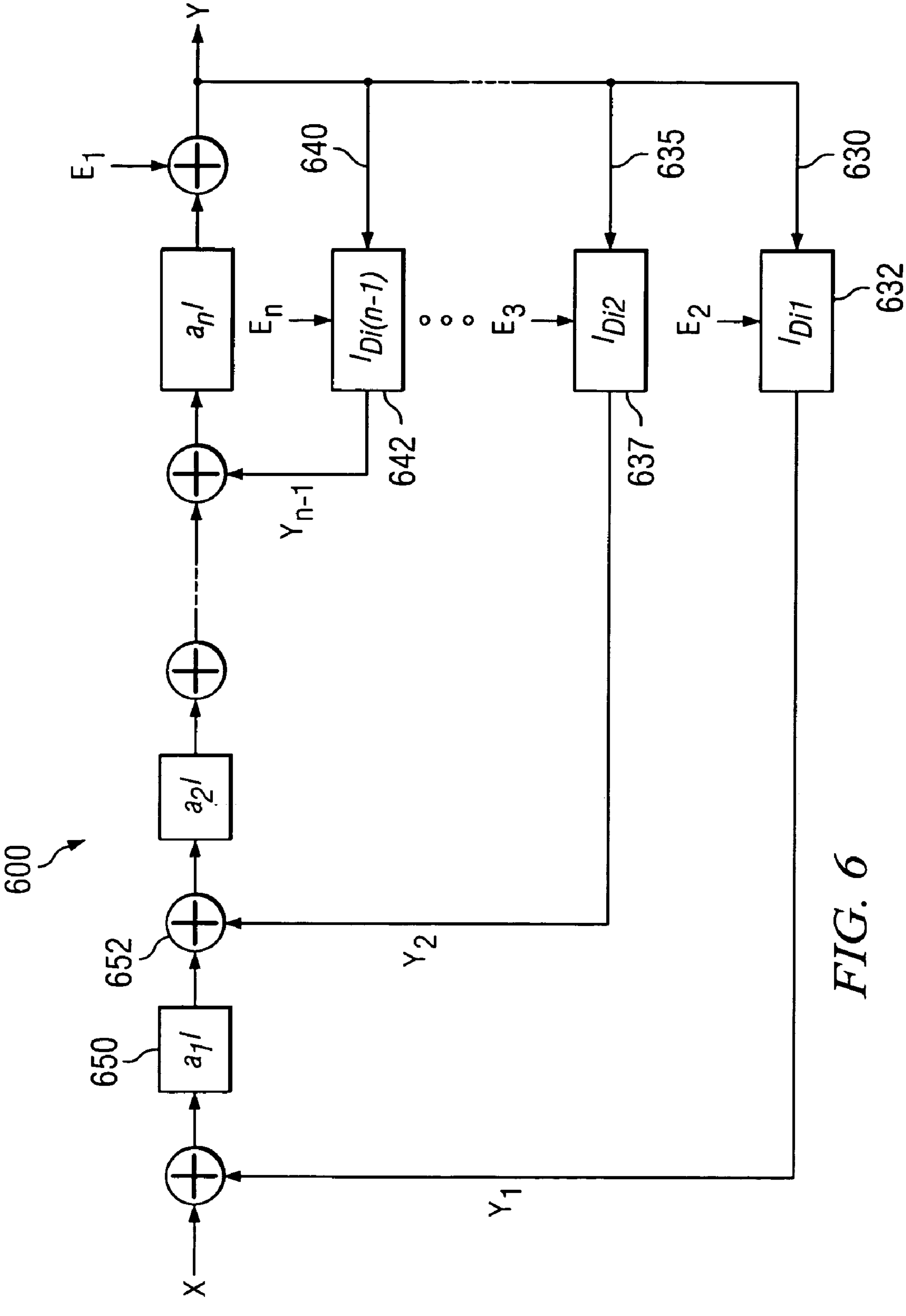
FIG. 6 is a diagram of an expanded N-th order single loop sigma-delta modulator.

With reference now to FIG. 6, there is shown a diagram illustrating an expanded N-th order single loop sigma-delta modulator 600. In order to be a candidate for expansion, an N-th order single loop sigma-delta modulator must meet two requirements: 1) It must have a single signal input and multi-bit quantization noise inputs (the expansion is also possible with single bit DAC, but results in a reduction of the DAC resolution for the multi-bit DAC) and 2) It must not have feed-forward or feedback paths that span different domains (analog and/or digital domains). Expansion involves the replacement of feedback loops in a sigma-delta modulator with circuits that have the same transfer function. The circuits which are used as replacements are themselves sigma-delta modulators. The use of these replacement circuits can help to reduce the overall noise level in a sigma-delta modulator because they offer a higher order shaping to a truncation error compared with the order of quantization error shaping. The error arises from a mismatch in resolution of digital-to-analog converters (DACs) present in the feedback loops and a quantizer in the sigma-delta modulator. Please refer to a co-pending and co-assigned patent application Ser. No. 10/860,620, entitled "A Method for Reducing DAC Resolution in Multi-bit Sigma Delta Analog-to-Digital Converter (ADC)," filed Jun. 3, 2004, for a detailed discussion.

The N-th order single loop sigma-delta modulator 600 has each of its N feedback loops replaced with circuits, which are represented in FIG. 6 as blocks, such as block 632 for feedback loop 630, block 637 for feedback loop 635, and block 642 for feedback loop 640. As discussed previously, the transfer function of a circuit (represented herein as a block) is equivalent to the transfer function of a feedback loop that it replaces. For example, if the feedback back loop has a unity transfer function, then the circuit that replaces it will also have a unity transfer function. According to technique introduced in the co-pending and co-assigned patent application Ser. No. 10/860,620, "A Method for Reducing DAC Resolution in Multi-bit Sigma Delta Analog-to-Digital Converter (ADC)," filed Jun. 3, 2004, the circuit may itself be a sigma-delta modulator.

While the technique can be effective in reducing the overall noise level of a sigma-delta modulator by noise shaping the truncation error that arises from the reduction in the digital output word of the multi-bit quantizer in the sigma-delta modulator and the digital input word of the DAC in the feedback loops, the truncation error can still be present in the sigma-delta modulator. This may be due to the fact that while the noise shaping can move the truncation error into a higher frequency band, it does not eliminate the truncation error. Therefore to optimize noise reduction when using the technique, the order of the noise shaping in the feedback loops should be at least equal to the order of the noise shaping in the sigma-delta modulator.

The N-th order sigma-delta modulator 600 of FIG. 6 shows that the truncation error $E_2$, which is injected into block 632 (representing an expansion circuit for the feedback loop 630) is passed through a block 650 (representing an analog integrator) and then combined with a digital feedback signal $Y_2$ generated by block 637. Therefore, a digital feedback signal $Y_1$ may be transformed into its analog representation, passed through a given transfer function (block 650) and then superposed with a second digital signal (the digital feedback signal $Y_1$ may be combined with the digital feedback signal $Y_2$ by an adder 652 after the digital feedback signal $Y_2$ is transformed into an analog signal). Note that the digital feedback signal $Y_1$ may comprise two signals: Y, an output of the N-th order sigma-delta modulator 600, and the truncation error $E_2$ (noise shaped). Since the truncation error $E_2$ is the result of noise from a digital truncation operation, it is a known quantity and the effect of the block 650 on the truncation error $E_2$ can be estimated and possibly cancelled.

Figure 7:
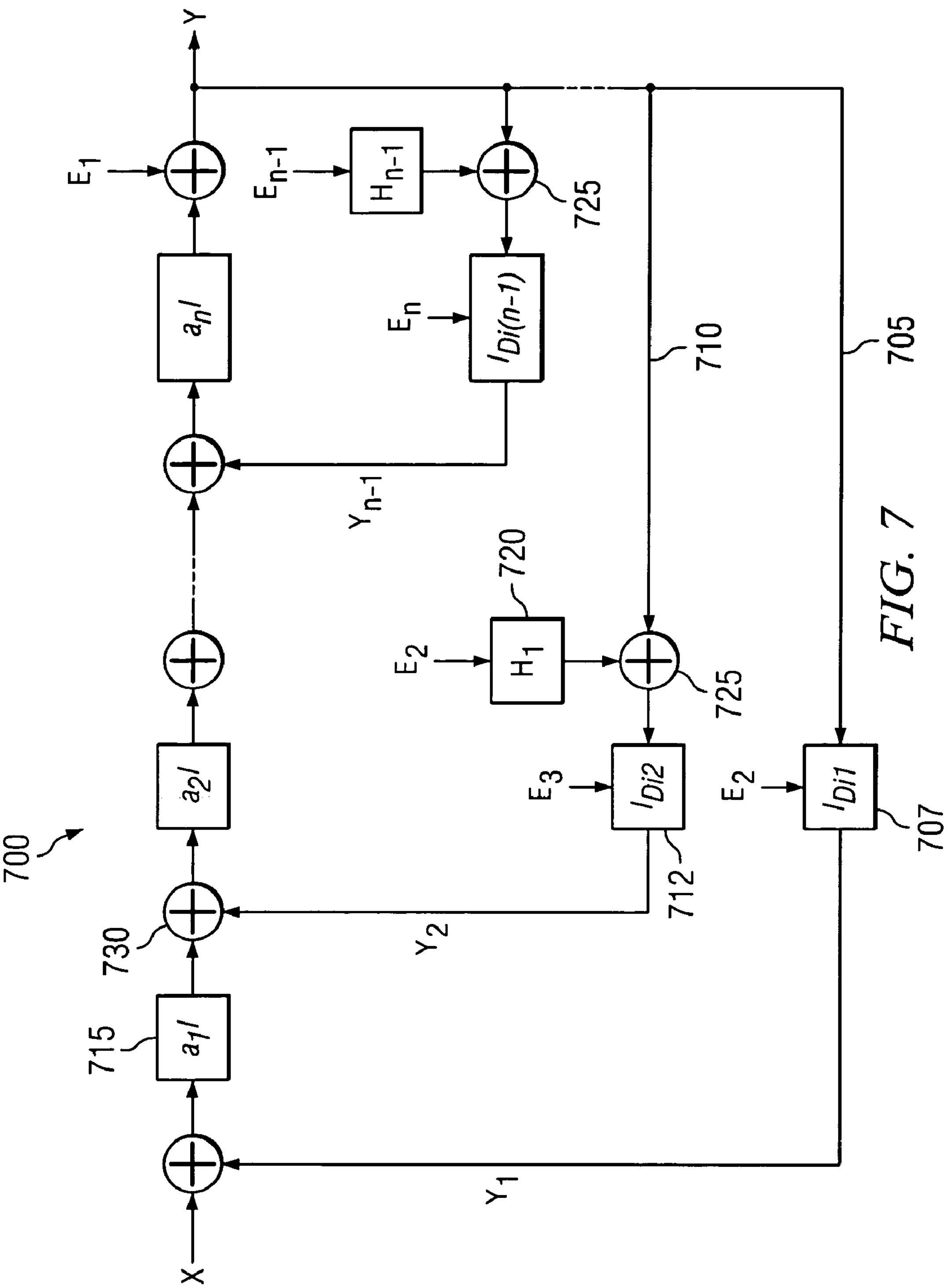
FIG. 7 is a diagram of an expanded N-th order sigma-delta modulator, wherein truncation error injected by a circuit replacing a feedback loop can be cancelled in a subsequent feedback loop, according to a preferred embodiment of the present invention.

With reference now to FIG. 7, there is shown a diagram illustrating an expanded N-th order sigma-delta modulator 700, wherein truncation error injected by a circuit replacing a feedback loop can be cancelled in a subsequent feedback loop, according to a preferred embodiment of the present invention. The N-th order sigma-delta modulator 700 features N feedback loops, such as feedback loops 705 and 710. Note that the feedback loop 705 may be referred to as an outermost feedback loop since it feeds back to an integrator that is closest to a signal input. According to a preferred embodiment of the present invention, each feedback loop can be replaced by a circuit with an equivalent transfer function. As displayed in FIG. 7, a circuit replacing a feedback loop can be represented as a block, such as block 707 replacing the feedback loop 705 and block 712 replacing the feedback loop 710.

As discussed previously, the effect of an integrator on a truncation error, such as integrator 715 on truncation error $E_2$ (from block 707), can be estimated and subsequently cancelled. A preferred location to eliminate the truncation error $E_2$ may be in a feedback loop adjacent to the feedback loop wherein $E_2$ is injected. Since the truncation error $E_2$ is injected in the feedback loop 705, the feedback loop 710 may be a good candidate for the elimination of the truncation error $E_2$. Note that the truncation error $E_2$ can be eliminated in feedback loops that are not adjacent to the feedback loop where the truncation error is injected and that the discussion of the truncation error being eliminated in an adjacent loop should not be construed as limiting the scope of the present invention.

A truncation error, such as the truncation error $E_2$, can be eliminated by applying an adjustment to the truncation error and then combining it with the truncation error so that cancellation takes place. According to a preferred embodiment of the present invention, the adjustment to the truncation error can occur in a feedback loop immediately adjacent to the feedback loop wherein the truncation error is injected. However, the adjustment can take place in other feedback loops, which may or may not be adjacent to the feedback loop wherein the truncation error being eliminated is injected, and several feedback loops may be used in the elimination rather than just a single feedback loop.

As shown in FIG. 7, the truncation error $E_2$, after having the adjustment (block 720) applied, can be added to the signal begin fedback along the feedback loop 710 (Y, the output of the sigma-delta modulator 700) by an adder 725. The signal, along with the adjusted truncation error $E_2$ can then be provided to the block 712, wherein a second truncation error $E_3$ can be injected. The second truncation error $E_3$ can be cancelled in a later feedback loop (not shown in FIG. 7). Output of the block 712, which can contain the output of the sigma-delta modulator 700, Y, the adjusted truncation error $E_2$, and the second truncation error $E_3$, can then be added (via adder 730) to the output of the integrator 715 (which can contain a modified version of the truncation error $E_2$). The combination of the adjusted truncation error $E_2$ and the modified version of the truncation error $E_2$ should result in the cancellation of the truncation error $E_2$ from the sigma-delta modulator 700.

Figure 8:
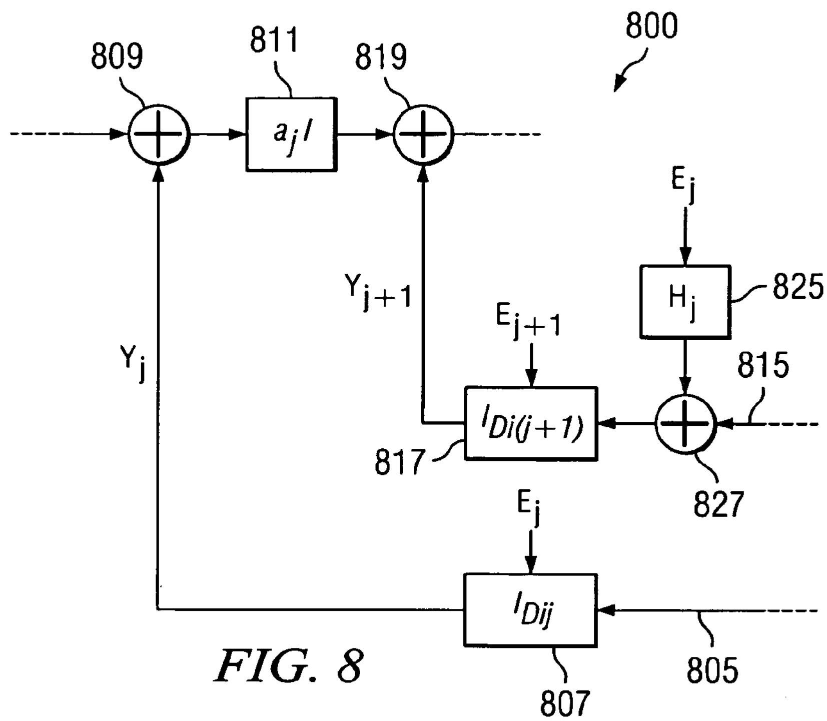
FIG. 8 is a diagram of a close-up view of a portion of a sigma-delta modulator, wherein truncation error injected by a circuit replacing a feedback loop can be cancelled in a subsequent feedback loop, according to a preferred embodiment of the present invention.

With reference now to FIG. 8, there is shown a diagram illustrating a close-up view of a portion of a sigma-delta modulator, wherein truncation error injected by a circuit replacing a feedback loop can be cancelled in a subsequent feedback loop, according to a preferred embodiment of the present invention. FIG. 8 displays a portion of a sigma-delta modulator 800, including two adjacent feedback loops 805 and 815, two adders 809 and 819 that can be used to combine signals from the feedback loops 805 and 815 back into a main signal path in the sigma-delta modulator 800 and an integrator 811, labeled "$a_j$I," in the main signal path and lying between the two adders 809 and 819. The feedback loop 805 has a block 807 representing the transfer function of a circuit replacing the feedback loop 805. Block 807 can be labeled $I_{Dij}$, which represents a j-th digital integrator of an i-th order sigma-delta modulator. The feedback loop 815 has a block 817 that can be labeled $I_{Di(j+1)}$, representing a (j+1)-th digital integrator. The feedback loop 815 may also include an adjustment block 825 that can be applied to truncation error $E_j$ and an adder 827 that can be used to combine the adjusted truncation error $E_j$ with a signal being carried on the feedback loop 815. Other feedback loops may be similarly constructed and labeled.

With reference now to FIG. **9*a*, there is shown a flow diagram illustrating an algorithm 900 for use in the cancellation of truncation error in a sigma-delta modulator, according to a preferred embodiment of the present invention. The algorithm 900** can be used to modify a sigma-delta modulator so that truncation error between a quantizer in the sigma-delta modulator and DACs in feedback loops in the sigma-delta modulator can be eliminated (canceled) so that the noise level in the sigma-delta modulator can be reduced.

An initial operation in the algorithm 900 can be to expand the sigma-delta modulator (block 905). Expansion of a sigma-delta modulator involves the replacement of each feedback loop in the sigma-delta modulator with a circuit with equivalent transfer function. Ideally, the circuit being used as a replacement is also a sigma-delta modulator, which preferably is implemented digitally from adders and memories. The expansion of a sigma-delta modulator involves the sequential substitution of feedback loops in the sigma-delta modulator with circuits with equivalent transfer functions as the feedback loops that they are replacing. The expansion can begin with the outermost feedback loop, i.e., the feedback loop that feeds back closest to the input signal, and then working until all feedback loops have been substituted. Prior to expansion, it should be verified that the sigma-delta modulator is a candidate for expansion, the requirements for being a candidate for expansion was discussed previously.

After expansion, for a feedback loop J, a truncation error $E_j$ that is injected into the sigma-delta modulator by the feedback loop J, should be arranged for cancellation by adding a term to feedback loop J+1 that is to be applied to the truncation error $E_j$ (block 910). According to a preferred embodiment of the present invention, the term added to the feedback loop J+1 and applied to the truncation error $E_j$ is an estimate of the truncation error $E_j$ after passing through an integrator in a main signal path in the sigma-delta modulator. Block 910 should be repeated for each feedback loop in the sigma-delta modulator. For a feedback loop that is closest to the output of the sigma-delta modulator, the term can be added to the output of the sigma-delta modulator.

After the truncation error $E_j$ and the adjustment term has been added to feedback loop J+1 for each feedback loop in the sigma-delta modulator (block 910), then the specific value of the term should be calculated (block 915). The value of the term can be different for each feedback loop and can be dependent upon the transfer function of the various feedback loops as well as integrators that are present in the main signal path of the sigma-delta modulator. Basically, for feedback loop J, an estimate of what the truncation error $E_j$ will look like after passing through integrator $a_jI$ is calculated and the estimate is used as the value of the term. When the truncation error $E_j$ is applied to the term and then combined with an output of integrator $a_jI$, the portion of the output of the integrator $a_jI$ that is due to the truncation error $E_j$ the adjusted truncation error $E_j$ is expected to cancel out, depending upon the accuracy of the estimate. After the calculation of the terms, the algorithm 900 can terminate.

Figure 9A:
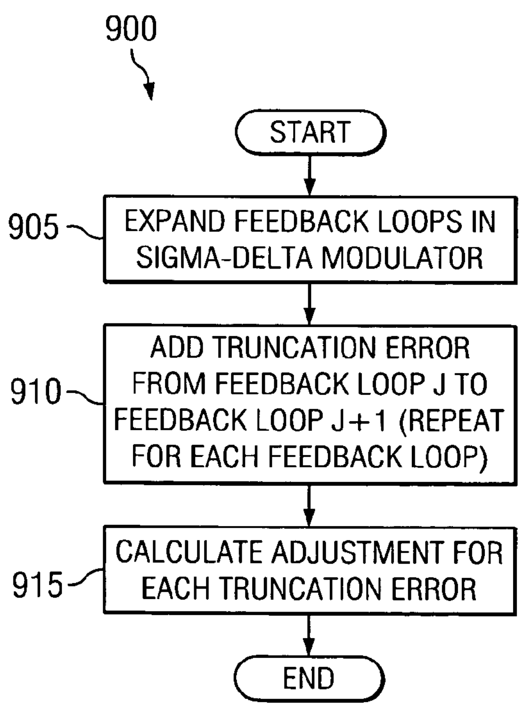
FIG. 9*a* is a diagram of an algorithm for canceling truncation error in a sigma-delta modulator, according to a preferred embodiment of the present invention.
Figure 9B:
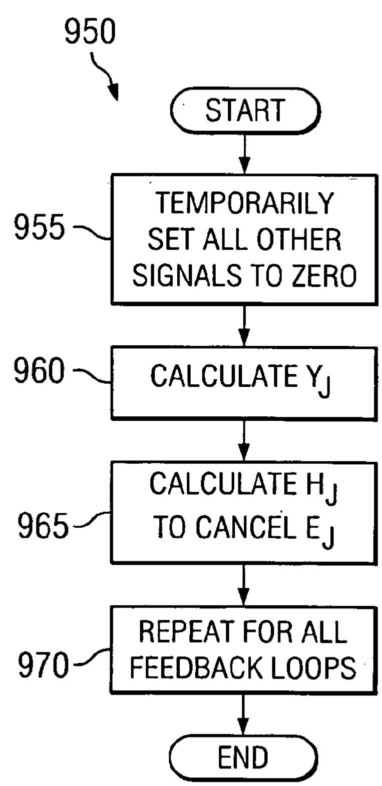
FIG. 9*b* is a diagram of an algorithm for computing the terms that can be used to cancel truncation error in feedback loops of a sigma-delta modulator, according to a preferred embodiment of the present invention.

With reference now to FIG. 9*b*, there is shown a flow diagram illustrating an algorithm 950 for computing the terms that can be used to cancel out truncation error in feedback loops of a sigma-delta modulator, according to a preferred embodiment of the present invention. According to a preferred embodiment of the present invention, the algorithm 950 can be used to compute (calculate) the adjustment (referred to previously as the term) for each truncation error in a sigma-delta modulator. The algorithm 950 can be used in block 915 of algorithm 900 (FIG. 9*a*), for example. For a feedback loop J, an initial operation involves setting all other signals in the sigma-delta modulator to zero (block 955). This can simplify the computation of the contribution of solely the truncation error $E_j$.

With all signals other than the truncation error Ej set to zero, the value of the output of the feedback loop J can be expressed as: $Y_j=(1-z^{-2})^i E_j$ (block 960). Since the truncation error $E_j$ has to also cancel the term $H_j$ and the digital integrator $I_{Di(j+1)}$ (from feedback loop J+1) may have a unitary transfer function, the following equation can be written:

$$a_jI*E_j(1-z^{-1})-E_jH_j=0.$$

Therefore, to cancel out $E_j$, $H_j$ can be calculated as: $H^j=a_jz^{-1}(1-z^{-1})^{i-1}$ (block 965). If I changes to $I_0$, then $H_j$ can change to $H_j=a_j(1-z^{-1})^{i-1}$. Note that it is also possible to inject and cancel the truncation error $E_j$ by moving the term and the adding point to other feedback loops. In such a situation, the term $H_j$ would necessarily be different, but may be calculated in a similar way. The calculations can then be repeated for all remaining feedback loops (block 970). Once all feedback loops have been processed, the algorithm 950 can then terminate.

Figure 10A:
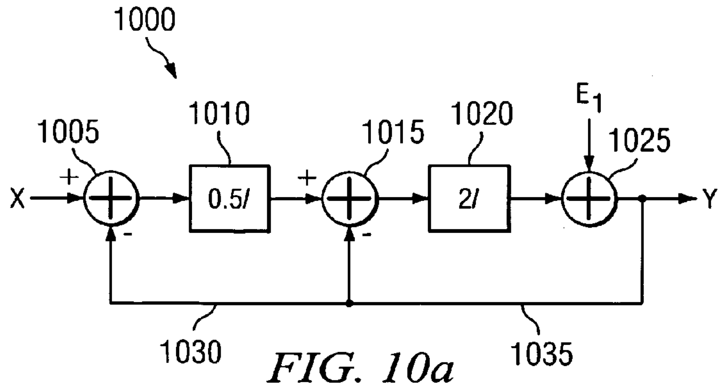
FIGS. 10*a* and 10*b* are diagrams of different second-order sigma-delta modulators.

With reference now to FIG. 10*a*, there is shown a diagram illustrating an exemplary second-order sigma-delta modulator 1000. The second-order sigma-delta modulator 1000 is comprised of a pair of adders 1005 and 1015, a pair of integrators 1010 and 1020, and a quantization noise source E1 that can be additively combined into the second-order sigma-delta modulator 1000 with an adder 1025. The second-order sigma-delta modulator 1000 can have a pair of feedback loops 1030 and 1035, wherein the feedback loop 1030 is the outermost feedback loop since it feeds back to a point closer to the input signal. Note that the integrators in this particular second-order sigma-delta modulator 1000 are analog integrators with one delay with transfer functions expressible as:

$$\frac{z^{-1}}{1-z^{-1}}.$$

The overall transfer function of the second-order sigma-delta modulator 1000 can be expressible as: $Y=z^{-2}X+(1-z^{-1})^2E_1$, wherein X is the input and Y is the output of the second-order sigma-delta modulator 1000.

Figure 10B:
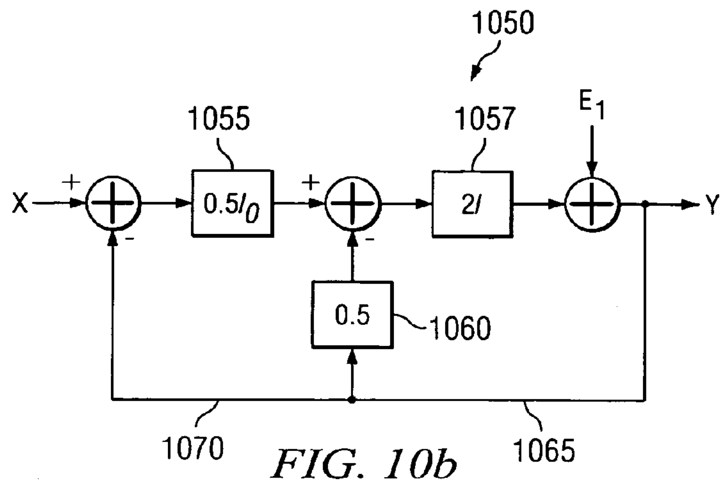

With reference now to FIG. 10*b*, there is shown a diagram illustrating an alternate second-order sigma-delta modulator 1050. The alternate second-order sigma-delta modulator 1050 has the same order as the second-order sigma-delta modulator 1000 shown in FIG. 10*a*. An advantage of the alternate second-order sigma-delta modulator 1050 may be that it can have an improved dynamic range when compared to the second-order sigma-delta modulator 1000. A main difference in the design of the alternate second-order sigma-delta modulator 1050 being that an initial integrator 1055 is now an analog integrator with no delay instead of the integrator 1010, which is an analog integrator with one delay used in the second-order sigma-delta modulator 1000. Note that a second integrator 1057 should have a similar transfer function as the second integrator 1020. A second difference being a scaling block 1060 present in a feedback loop 1065 of the alternate second-order sigma-delta modulator 1050 while a second feedback loop 1070 remains unchanged. The overall transfer function of the alternate second-order sigma-delta modulator 1050 can be expressible as: $Y=z^{-1}X+(1-z^{-1})^2E_1$.

Figure 11:
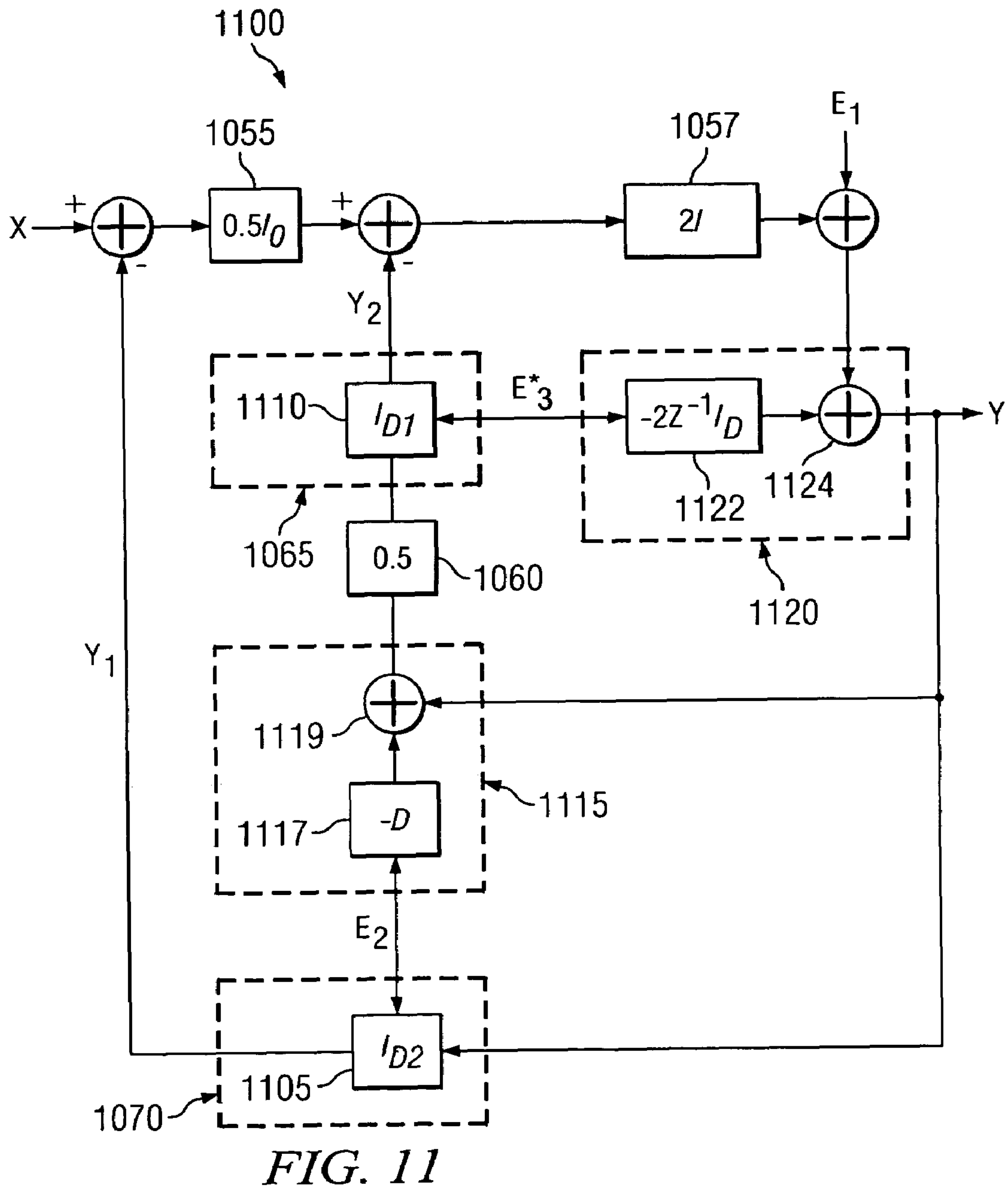
FIG. 11 is a diagram of an expanded second-order sigma-delta modulator, with terms that can be used for canceling truncation error inserted, according to a preferred embodiment of the present invention.

With reference now to FIG. 11, there is shown a diagram illustrating an expanded second-order sigma-delta modulator 1100, with terms that can be used for canceling truncation error inserted, according to a preferred embodiment of the present invention. The expanded second-order sigma-delta modulator 1100 may basically be the alternate second-order sigma-delta modulator 1050 from FIG. 10*b* with its feedback loops having been replaced with circuits with equivalent transfer functions and terms that can be used for canceling truncation error inserted. The outermost feedback loop 1070 of the alternate second-order sigma-delta modulator 1050 can be replaced with a block 1105 while the inner feedback loop 1065 of the alternate second-order sigma-delta modulator 1050 can be replaced with a block 1110. Note that the scaling block 1060 remains in the inner feedback loop 1065.

A term 1115 that can be used to cancel a truncation error $E_2$, which can be injected into the alternate second-order sigma-delta modulator 1050 by the block 1105, can be inserted into the inner feedback loop (formerly feedback loop 1065). The term 1115 can comprise a block 1117 which can be applied to the truncation error $E_2$ and an adder 1119 that can be used to combine the adjusted truncation error $E_2$ into a signal being carried on the inner feedback loop. A term 1120 that can be used to cancel the truncation error $E_3$, which can be injected into the alternate second-order sigma-delta modulator 1050 by the block 1110, can be inserted into the main signal path of the alternate second-order sigma-delta modulator 1050. The term 1120 can comprise a block 1122 which can be applied to the truncation error $E_3$ and an adder 1124 that can be used to combine the adjusted truncation error $E_3$ into a signal being carried on the main signal path of the alternate second-order sigma-delta modulator 1050.

For discussion purposes, let the quantizer (not shown) in the alternate second-order sigma-delta modulator 1050 have $N_1$ bits of resolution and the feedback loops have $N_2$ (feedback loop 1070) and $N_3$ (feedback loop 1065) bits of resolution, wherein $N_1>\max\{N_2, N_3\}$, i.e., $N_1$ is greater than either $N_2$ or $N_3$. Then, a relationship between Y (the output of the expanded second-order sigma-delta modulator 1100) and $Y_1$ (the output of the feedback loop 1070) can be expressed as:

$$Y_1=Y+(1-z^{-1})^2E_2,$$

while the relationship between Y and $Y_2$ (the output of the feedback loop 1065) can be expressed as:

$$Y_2=0.5*(Y-(1-z^{-1})E_2)+(1-z^{-1})E_3.$$

Since Y is equal to:

$$Y=((X-Y_1)*0.5I_0)-Y_2)*2I-2I*DE_3,$$

Y can be simplified to:

$$Y=z^{-1}X+(1-Z^{-1})^2E_1.$$

Note that $E_2$ and $E_3$ are not shown above since both have been cancelled.

The truncation error $E_2$ can be cancelled as follows: suppose inputs and other signals are temporarily set to zero. The second-order sigma-delta (block 1105) generates $(1-z^{-1})^2E_2$. In one branch, the truncation error $E_2$ is applied to the analog integrator 1055 ($0.5I_0$) and in another branch, the truncation error $E_2$ is applied to $-(1-z^{-1})$ (also referred to as $-D$(block 1117)), scaled by 0.5 (by scaling block 1060), and a first-order sigma-delta modulator (block 1110), which can have a unitary transfer function. Therefore, $$(1-z^{-1})^2E_2*0.5*\frac{1}{1-z^{-1}}-E_2*(1-z^{-1})*0.5=0.$$

The truncation error $E_3$ can be cancelled as follows: the truncation error $E_3$ may only be present in the feedback loop 1065. The first-order sigma-delta (block 1110) generates $(1-z^{-1})E_3$, then it may be provided to the analog integrator 1057. Back in the digital domain, $E_3$ also goes through a digital integrator (block 1122) with one delay. Since the transfer function of the digital integrator (block 1122), $-2z_{-1}I_D$ may be equal to 2I, then $$(1-z^{-1})E_3*2I-(1-z^{-1})E_3*2*z^{-1}*I_D=0.$$

Since only the quantization noise $E_1$ shows up in the transfer function of the expanded second-order sigma-delta modulator 1100, only the resolution of the quantizer can have an effect upon the signal-to-noise ratio (SNR) of the expanded second-order sigma-delta modulator 1100. Therefore, the DACs in the feedback loops can be designed with coarse resolution.

Figure 12:
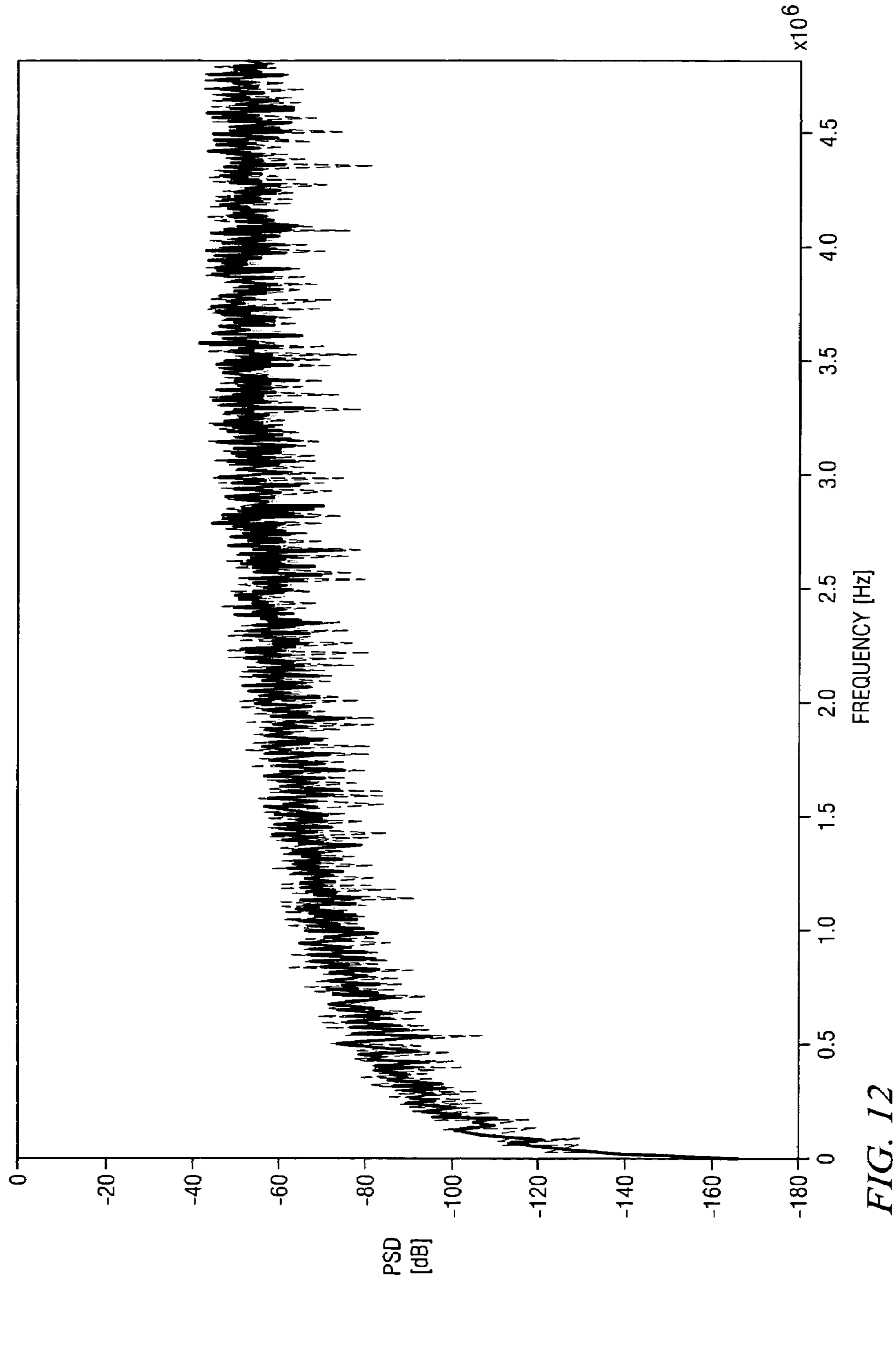
FIG. 12 is a power spectral density plot of an output of a second-order sigma-delta modulator with truncation error cancellation up to the sampling frequency bandwidth, according to a preferred embodiment of the present invention.

With reference now to FIG. 12, there is shown a data plot illustrating a power spectral density plot of an output to the expanded alternate second-order sigma-delta modulator 1100 from FIG. 11 with truncation error cancellation up to the sampling frequency bandwidth, according to a preferred embodiment of the present invention. The data plot shows the spectral behavior of the output of the second-order sigma-delta modulator 1100. Note that for FIG. 12 (and also FIGS. 13 and 14), the results were obtained using the following resolution model: $E_I$ is 4 bits (equivalent to 16 levels), $E_2$ is 3 levels, $E_3$ equals to 5 levels.

Figure 13:
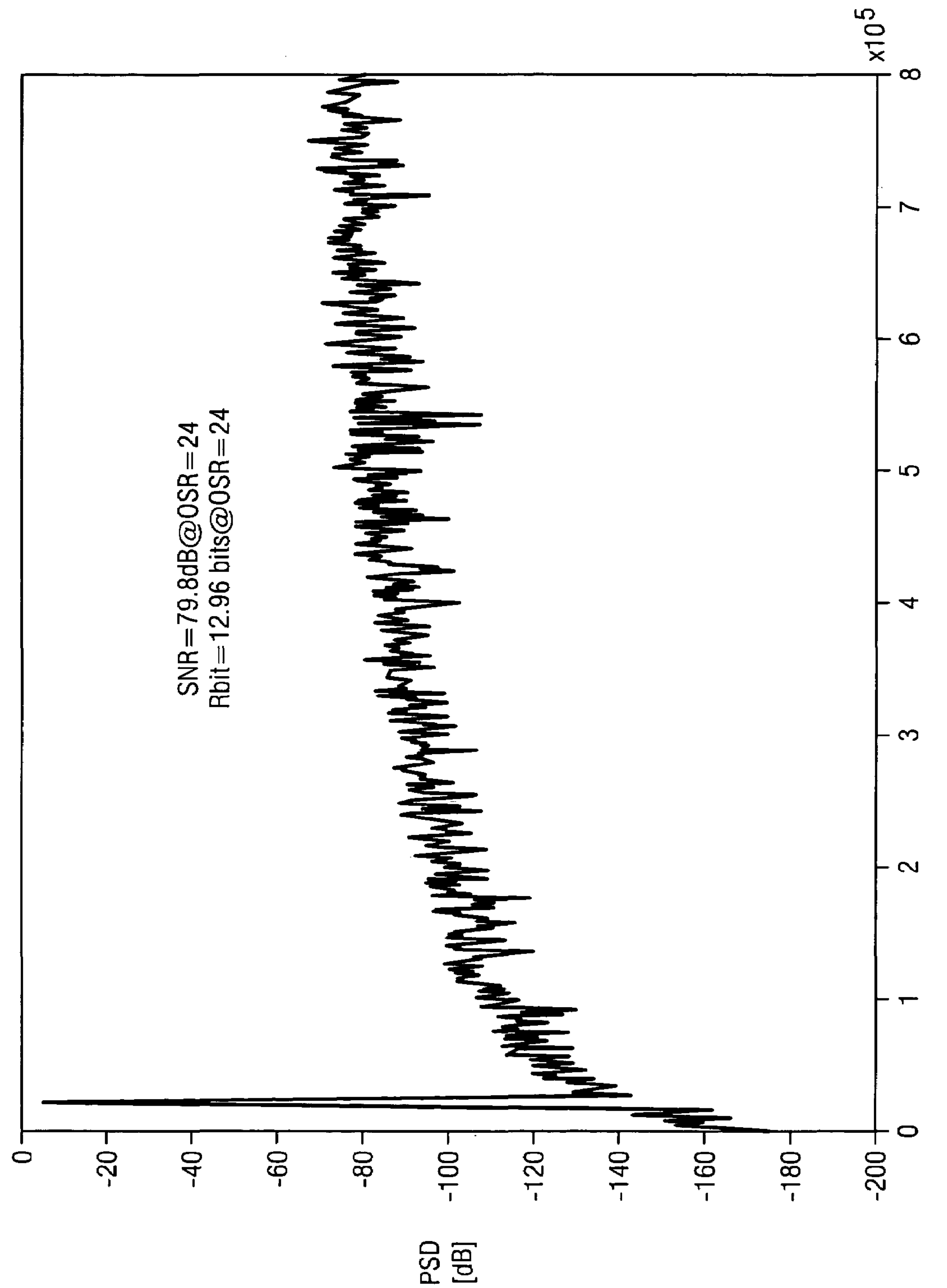
FIG. 13 is a power spectral density plot of an output of a second-order sigma-delta modulator with truncation error cancellation up to the signal frequency bandwidth, according to a preferred embodiment of the present invention.

With reference now to FIG. 13, there is shown a data plot illustrating a power spectral density plot of a signal that is the output of the second-order sigma-delta modulator 1100 from FIG. 11 with truncation error cancellation up to the signal frequency bandwidth, according to a preferred embodiment of the present invention. The data plot shows the spectral behavior of the output of the expanded alternate second-order sigma-delta modulator 1100. Clearly, when comparing the data plot of FIG. 13 with the data plot of FIG. 12, the power spectral density of the output of the expanded alternate second-order sigma-delta modulator 1100 has been significantly attenuated.

Figure 14:
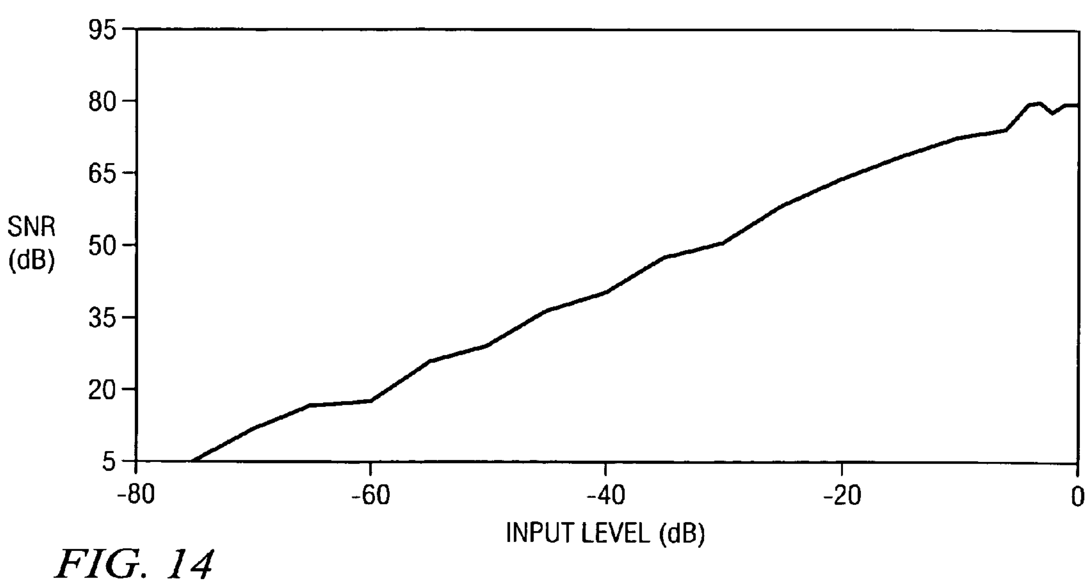
FIG. 14 is a signal-to-noise ratio plot for a second-order sigma-delta modulator with truncation error cancellation for various input signal levels, according to a preferred embodiment of the present invention.

With reference now to FIG. 14, there is shown a data plot illustrating the signal-to-noise ratio of the second-order sigma-delta modulator 1100 from FIG. 11 for various input signal levels, according to a preferred embodiment of the present invention. The data plot shows that the expanded alternate second-order sigma-delta modulator 1100 has a linearly increasing signal-to-noise ratio as the signal level of the input signal is increased.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for truncation error cancellation in a sigma-delta analog-to-digital converter (ADC), the method comprising:

expanding all feedback loops in the sigma-delta ADC;

for each expanded feedback loop, adding an adjusted truncation error $E_j$ injected to a feedback loop J to an inner feedback loop; and calculating a correction term for each adjusted truncation error $E_j$.

2. The method of claim 1, wherein the expanding comprises:

selecting an outermost feedback loop in the sigma-delta ADC;

replacing the selected outermost feedback loop with a circuit with an equivalent transfer function; and repeating the selecting and replacing for remaining feedback loops in the sigma-delta ADC.

3. The method of claim 2, wherein the expanding further comprises prior to the selecting, verifying that the sigma-delta ADC can be expanded.

4. The method of claim 3, wherein the verifying comprises:

determining if the sigma-delta ADC has a single signal input;

determining if the sigma-delta ADC has multiple noise inputs; and determining if the sigma-delta ADC has no feed-forward and feedback loops crossing domains.

5. The method of claim 4, wherein a domain is either an analog or a digital domain.

6. The method of claim 1, wherein the inner feedback loop is further away from the signal input than the feedback loop J.

7. The method of claim 6, wherein the inner feedback loop is a feedback loop immediately adjacent to the feedback loop J.

8. The method of claim 6, wherein the inner feedback loop is a feedback loop not immediately adjacent to the feedback loop J.

9. The method of claim 1, wherein the adjusted truncation error $E_j$ is added to a plurality of inner feedback loops.

10. The method of claim 9, wherein the plurality of inner feedback loops are all further away from the signal input than the feedback loop J.

11. The method of claim 1, wherein the adjusted truncation error $E_j$ is a truncation error of the feedback loop multiplied with the correction term.

12. The method of claim 11, wherein the feedback loop J is provided to an integrator, and wherein the correction term is based upon a transfer function of the integrator.

13. The method of claim 12, wherein the correction term can be expressed as:

$$H_j=a_jz^{-1}(1-z^{-1})^{i-1},$$

wherein $H_j$ is the correction term, $a_j$ is the coefficient of the transfer function of the integrator, and i is the order of the sigma-delta modulator.

14. The method of claim 13, wherein if the integrator has no delay, then the correction term can be expressed as:

$$H_j=a_j(1-z^{-1})^{i-1}.$$

15. A method for truncation error cancellation in a sigma-delta analog-to-digital converter (ADC), the method comprising:

expanding all feedback loops in the sigma-delta ADC;

selecting an outermost feedback loop J, placing a truncation error $E_j$ in an inner feedback loop;

calculating an adjustment for the truncation error $E_j$, wherein the adjusted truncation error cancels out the truncation error in the feedback loop J; and repeating for remaining feedback loops.

16. The method of claim 15, wherein the truncation error $E_j$ is provided to an integrator, and wherein the calculating comprises:

temporarily zeroing out all signals other than the truncation error $E_j$; and computing the adjustment, wherein the adjustment is equal to an output of the integrator.

17. The method of claim 16, wherein the adjustment is equal to: $H_j=a_jz^{-1}(1-z^{-1})^{i-1}$, wherein $H_j$ is the adjustment, $a_j$ is the coefficient of a transfer function of the integrator, and i is the order of the sigma-delta modulator.

18. The method of claim 15, wherein the outermost feedback loop is the feedback loop closest to a signal input.

19. The method of claim 15, wherein an inner feedback loop is further away from a signal input than the outermost feedback loop.

20. The method of claim 15, wherein the truncation error $E_j$ is provided to an integrator, wherein the integrator has a transfer function, and wherein the truncation error $E_j$ multiplied by the transfer function added to the adjusted placed truncation error is equal to zero.

* * * * *